(12) United States Patent
Zheng

(10) Patent No.: US 6,788,983 B2
(45) Date of Patent: Sep. 7, 2004

(54) AUDIO TRIGGER DEVICES

(75) Inventor: Yong Ping Zheng, Kowloon (HK)

(73) Assignee: The Hong Kong Polytechnic University, Kowloon (HK)

( * ) Notice: Subject to any disclaimer, the term of this patent is extended or adjusted under 35 U.S.C. 154(b) by 457 days.

(21) Appl. No.: 09/778,040

(22) Filed: Feb. 7, 2001

(65) Prior Publication Data

US 2002/0106089 A1 Aug. 8, 2002

(51) Int. Cl.[7] ............................................. G06F 17/00
(52) U.S. Cl. ......................................... 700/94; 381/61
(58) Field of Search .............................. 381/61, 58, 85, 381/77; 700/94; 345/158

(56) References Cited

U.S. PATENT DOCUMENTS 4,885,766 A * 12/1989 Yasuoka et al. ........ 379/102.03
6,107,914 A * 8/2000 Greene .................. 340/426.25

* cited by examiner

Primary Examiner—Minsun Oh Harvey
(74) Attorney, Agent, or Firm—Leydig, Voit & Mayer, Ltd.

(57) ABSTRACT

An audio trigger device has a number of buttons that can be depressed to create different audio signals with 5 different features. The audio signals are used to remotely control a computer running slide presentation software that has an audio channel to collect sound signals. The features of the audio signals are detected by the computer as commands for controlling the progress of the slide presentation by simulating keystrokes, mouse actions, or their combinations for the control commands of the presentation software.

4 Claims, 9 Drawing Sheets

1: Esc
2: up
3: Enter
4: left
5: down
6: right
7: mouse left button pressed/released
8: mouse move up
9: mouse left button double click
*: mouse move left
0: mouse move down
: mouse move right

AUDIO TRIGGER DEVICES

BACKGROUND OF THE INVENTION

1. Field of the Invention

The invention relates to audio trigger devices.

2. Description of Prior Art

The invention relates more particularly to an audio trigger control method and hand-holdable audio trigger devices to independently control some other equipment to change a setting or act as a command signal for example. Depending on the different applications of the audio trigger control, it can be used for a relatively short distance or a relatively large distance as will be explained more fully below.

A particular application for an audio trigger device of the the present invention is a computer slide presentation. At present during a presentation, a sequence of slides can be controlled mainly by three commands including 'next slide', 'previous slide' and 'slide selection'; the command 'next slide' is used the most often. Every computer presentation software normally has at present three commands achieved by keystrokes or mouse actions or their combinations. Apparatas known no the art to input these commands include: a keyboard, a mouse, and a voice control interface. Besides wired keyboards and mice that are used to control a computer slide presentation, various wireless mice or pointing devices are used for controlling the presentation. The wireless functions of the devices are achieved using radio frequency (RF) or infrared transmitting technologies. When using a voice control interface, the presenter's voice is received by a microphone in the computer and patterns of the voice signals are detected for deriving, commands to simulate corresponding keystroke or mouse actions.

One drawback of an infrared pointing device is that it should point directly at the receiver, and a limited controlling distance is another drawback. A drawback of an RF pointing device is its comparative expense. Also, different countries may allow use of different frequency bands and transmitting powers for the RF pointing device. This makes a specific RF pointing device inapplicable internationally. To avoid interfering with other RF devices, the RF pointing device is inhibited for use in some situations, such as in aeroplanes during flying. In addition, the RF or infrared receivers may have to be physically connected to the computer by wires.

With voice control, audiences may by disturbed and confused and fluency of the presentation interrupted by commands to the computer, especially when the computer cannot immediately correctly derive the command. If voice control is used, the equipment must be trained for every presenter and advised which presenter is using the equipment. When there is a lot of background noise, the efficiency of voice control interface is often very poor.

SUMMARY OF THE INVENTION

It is an object of this invention to overcome or at least reduce this problem.

According to the invention there is provided a trigger control system comprising of an audio trigger device having a number of buttons that can be depressed to create different audio signals with different features, and a main equipment that has an audio channel to collect audio signals, in which the features are detected by the main equipment as commands for altering or controlling operation of the main equipment.

The audio trigger signals may be generated by electrical circuits, or mechanical means, for examples, by sound pipes mounted on the device.

The audio trigger signals may be generated by a mobile phone that can generate touch tones with different frequencies by depressing key pads.

The different features may be coded in frequency domain and/or time domain.

A trigger computer presentation control system may be provided including an audio trigger device having a number of buttons that can be depressed to create different audio signals with different features, and a computer running a slide presentation software that has an audio channel to collect sound signals, in which the features are detected by the computer as commands for controlling the progress of the slide presentation by simulating keystrokes, mouse actions, or their combinations for the control commands of the presentation software.

A trigger computer control system may be provided comprising a laser pointing means and an audio trigger generating means having a number of buttons, one of which can be depressed to activate the laser pointing mean to generate laser beam for pointing purpose, and others of which can be depressed to activate audio trigger generating means to create audio signals with different features for the computer, in which the signals act as command signals for altering or controlling operation of the computer.

An audio trigger control system may be provided including a microphone for receiving aural presentation sounds of a user, a main equipment including an amplifying circuit and a loudspeaker, an audio trigger device that can generate trigger signals with different features by depressing a number of buttons mounted on a surface of the microphone, a communication channel connecting the microphone to the main equipment for transmitting the aural presentation and the trigger signals to the main equipment, which the transmitted trigger signals are detected and act as command signals for altering or controlling operation of the main equipment, including altering or controlling the effective amplification to adjust presentation sound outputs of the loudspeaker.

The communication channel is preferably a radio channel.

BRIEF DESCRIPTION OF THE DRAWINGS

Hand-holdable audio trigger control methods and devices according to the invention will now be described by way of example with reference to the accompanying drawings in which.

DESCRIPTION OF THE PREFERRED EMBODIMENTS

Embodiments of the invention can take many forms and use technology that is well-practised in the art. In each case, the host or main equipment, such as a personal computer, or an audio amplifier for example, has an audio receiver, typically a microphone and associated circuits that can respond to input command signals to alter the output or actions of the main equipment dependent upon those signals. The input or command signals can be relatively simple, that is to say notes at different frequencies, generated mechanically by the audio trigger device. They can also be relatively complicated with different features in frequency or time domain, generated electrically by the audio trigger device. Thus a user may use the audio trigger device from time to time to alter the actions or performance of the main equipment. Generally stated, embodiments of the invention provide audio trigger control methods and hand-holdable audio trigger devices which are mechanically or electrically operated to generate different sounds with different features in frequency or time domain when different keys are depressed, either when a single key is depressed, or when two or more keys are depressed simultaneously. The audio control signals are detectable by the main equipment through its audio channel, but are not necessarily audible to the human ear. The audio trigger devices and the audio trigger control methods are inherently inexpensive.

Figure 1:
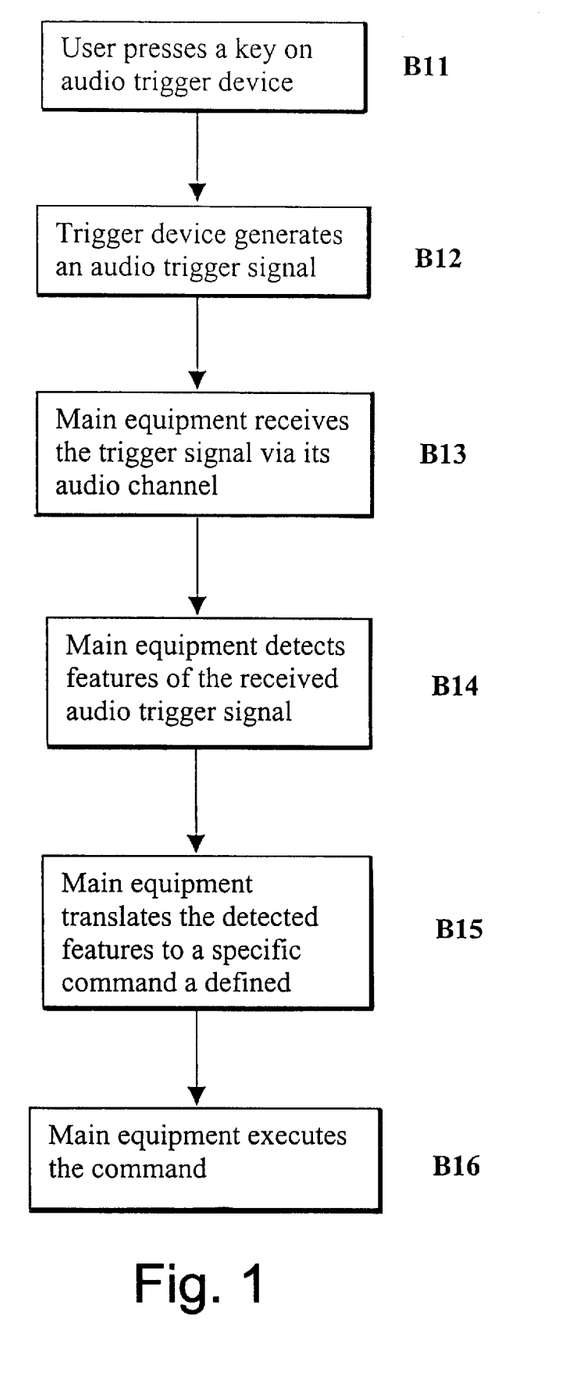
FIG. 1 is a block diagram of a control process of the audio trigger.

FIG. 1 summarizes the audio trigger control method as a block diagram. A user first depresses a key on trigger device (B11), and a trigger device generates an audio signal with a specific pattern (B12). After the main equipment receives the trigger signals via its audio channel (B13), it detects the pattern of the received signal (134). If the pattern is a meaningful as defined, the main equipment translates it to a corresponding command (215). Finally, the main equipment executes the command as defined (B16), simulating a series of keystrokes or mouse actions of a computer equipment for example.

Figure 2:
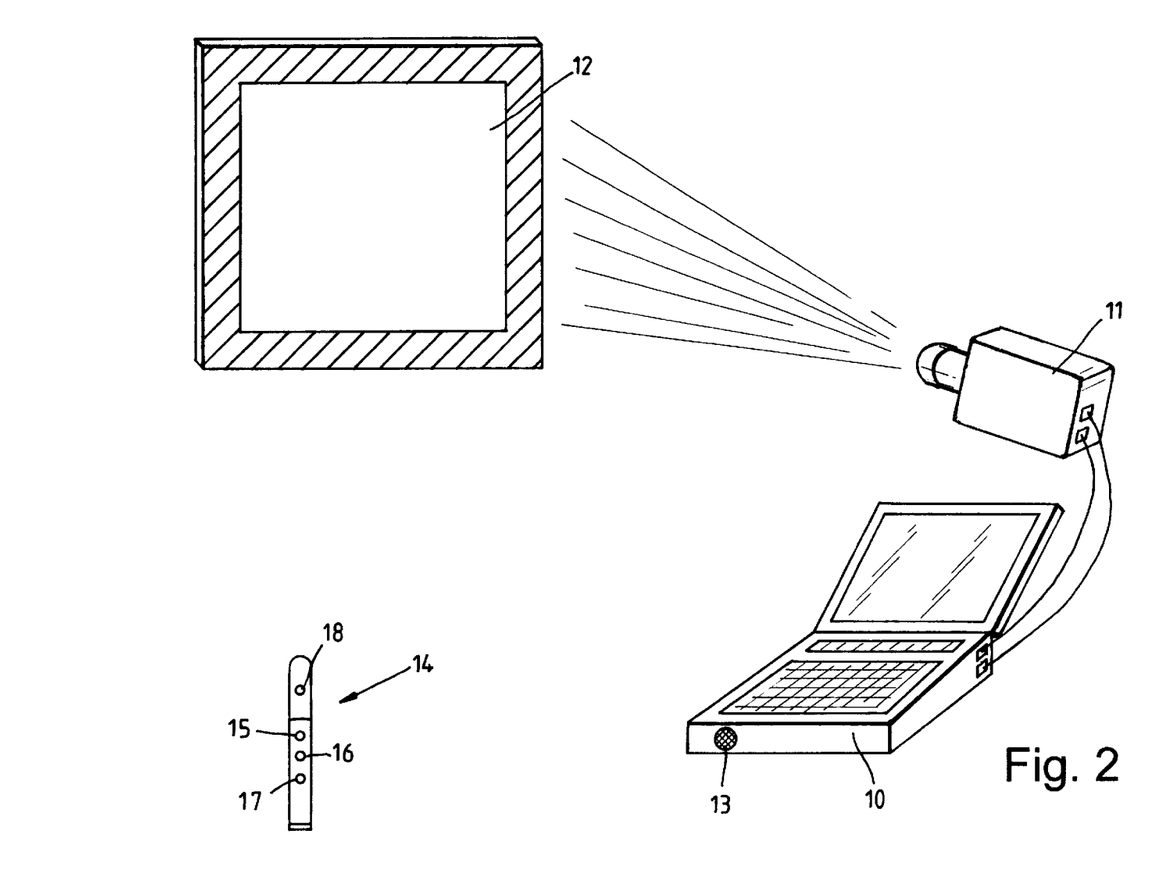
FIG. 2 is a schematic layout of a computer slide presentation with an audio trigger device.

Referring to FIG. 2, a slide presentation equipment includes a personal computer 10, a projector 11 and a screen 12. The computer has a built-in microphone 13 for receiving audio signals from a laser pointer 14. Besides a button 18 for activating the laser generator, the laser pointer has additional three resiliently biased upstanding buttons 15, 16 and 17 that can depressed to generate three different tones; this comprises an audio trigger device. In use, the audio trigger device is used for providing command signals via the computer 10 to control the operation of the computer presentation software. Such command signals are typically 'next slide', 'previous slide' and 'slide selection'. This enables a presenter that is using the presentation software in the computer, referred to earlier as a 'main equipment', to remotely control the computer presentation software without visiting the computer. Since the 'next slide' command is used most often, the key for this command can be arranged larger than the other two. In previous arrangements, the presenter is required to operate a mouse of the computer, for example, or have a hand-held controller wired to the computer for changing the slides during the presentation. The drawbacks of other wireless methods have already been discussed above.

The computer is arranged in a manner generally familiar to persons skilled in the art to differentiate between the different tones (i.e. frequencies of the audio outputs of the trigger device) or other frequency or time coded features received by the microphone 13 for determining the various different commands. Its is quite usual for computers to have in-built microphones for other purposes, such as voice communication channels, and so in those cases an added differentiating circuit or program can be easily incorporated in the computer to enable the computer to respond to the audio trigger device signals, such as already known art in the field. Typically, it is necessary however in order to avoid stray sounds being acted upon, that may be confused as command signals, to include a timing function that inhibits the computer from responding to audio signals of less than, say, half a second duration, or to use signals of more than one frequency or with more complicated features to represent each command.

Figure 3:
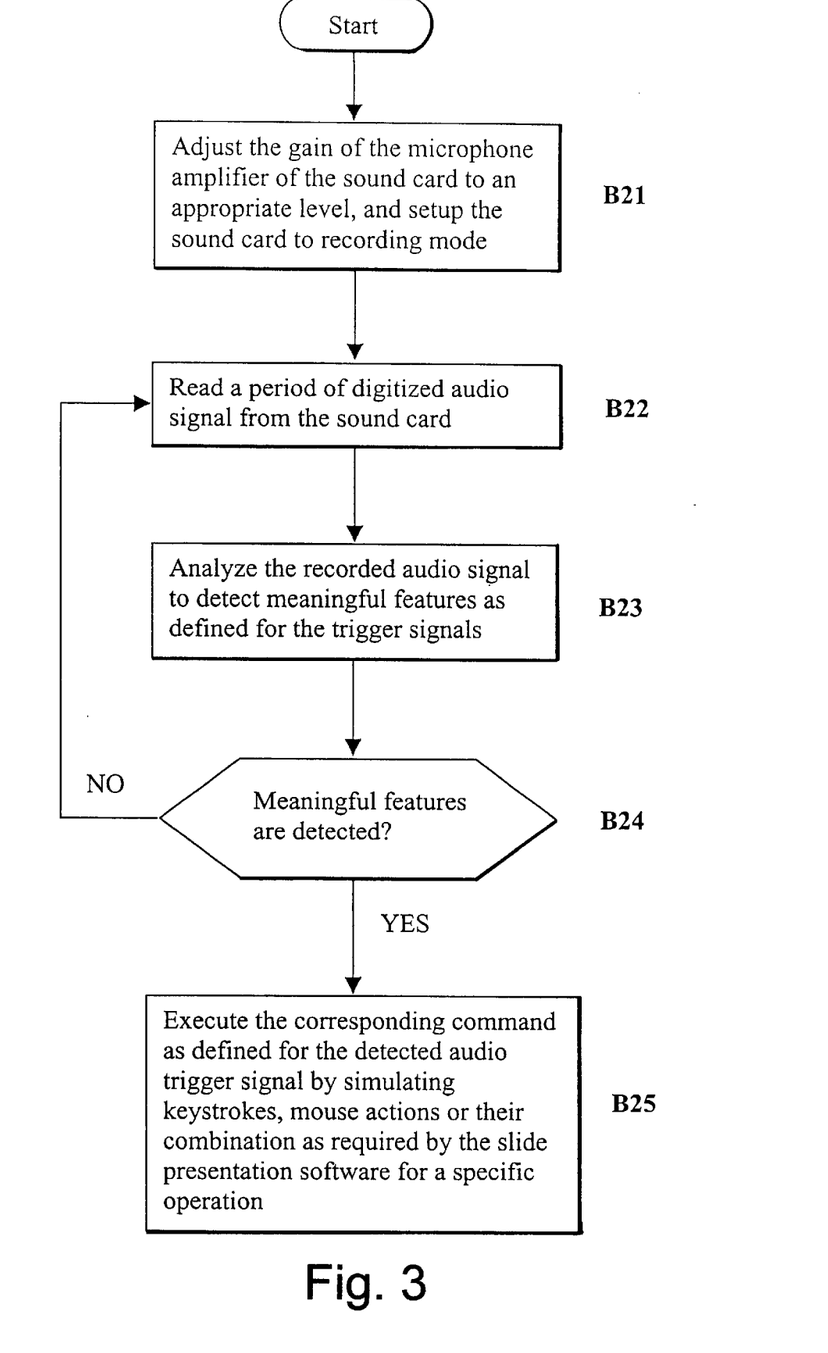
FIG. 3 is a block diagram of the program for the audio trigger control.

FIG. 3 shows a block diagram of a program for the audio trigger control for the computer slide presentation. When the program is executed, it first initializes the sound device, a sound card for example, to adjust the gain of the microphone amplifier to an appropriate level, and setups for recording mode (B21). The program reads a period, 0.1s for example, of digitized audio signals from the sound card (B22). Then the audio signals are analyzed to detect meaningful features as defined for trigger signals (B23). For example, east Fourier Transform (FFT) algorithm can be used to detect the features in frequency domain. If a meaningful feature is detected (B24), the program executes the corresponding command by simulating keystrokes, mouse actions or their combinations (B25), which can be used to control the presentation software running in the computer. If no meaningful feature is detected, another period of audio signals is recorded (B22), and analyzed to detect meaningful features (B23), and so on. The program for the audio trigger control can be embedded into the presentation software as a sub-function.

Generally, one trigger signal generated by pressing one key on the audio trigger device represents one specific command in the main equipment. For some purposes, a key can also be defined toggling among a series of different commands. When a key is first detected, one action is simulated. When it is detected again, another action is simulated, and so on. For example in an audio trigger device with three keys, two keys can be defined as NEXT key and PREVIOUS key to select the next slide and last slide, respectively. The remaining key can be defined as SELECTION key to select a specific slide for presentation. When the SELECTION key is first detected, the program for the audio trigger control simulates a command to activate a menu showing the titles of all slides for selection. Then the presenter can select a slide by pressing NEXT key or PREVIOUS key. After the desired slide is selected in the menu, then the presenter presses the SELECTION key again. This time, the program simulates an ENTER key to confirm the selection of the slide in the menu. The presentation software can then perform corresponding operation to present the selected slide.

The program for the audio trigger control in the computer can further have the function to let the user define the simulating macros of keystrokes and mouse actions for each key on the audio trigger device. The software can also have the function to let the user register for a new audio trigger device with different patterns of audio control signals compared with those of the default audio trigger device. During the registration, the software collects the audio signals for each keys of the new audio trigger device, and then analyzes and records their patterns for later detecting of these signals.

Figure 4:
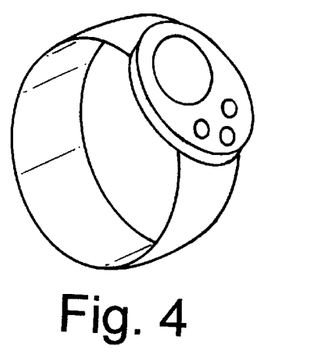
FIG. 4 is an isometric view of an audio trigger device.
Figure 5:
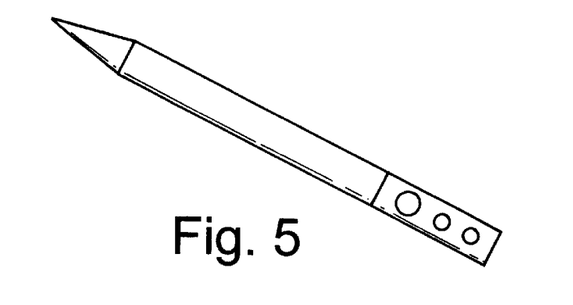
FIG. 5 is an isometric view of a further audio trigger device.
Figure 6:
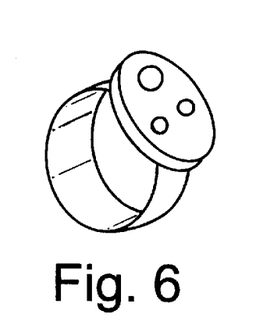
FIG. 6 is an isometric view of a yet further audio trigger device.

The audio trigger device may also be in the form of a wrist watch, a pen, or a finger ring (or a stand-alone hand-handable instrument) such as shown in FIGS. 4, 5, and 6. In each case, the audio trigger device has more than one (three in the figures for example) buttons to enable simple different respective tonal audio signals (or with other detectable features in frequency or time domain) to be emitted for receipt by the microphone 13.

Figure 7:
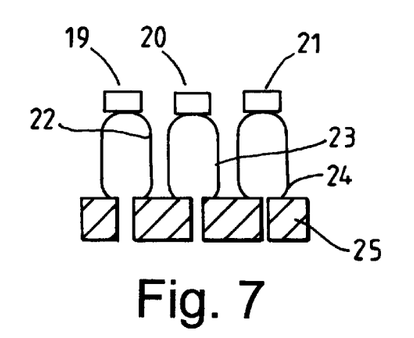
FIG. 7 is a cross-sectional view of an audio trigger device using air pipes.
Figure 8:
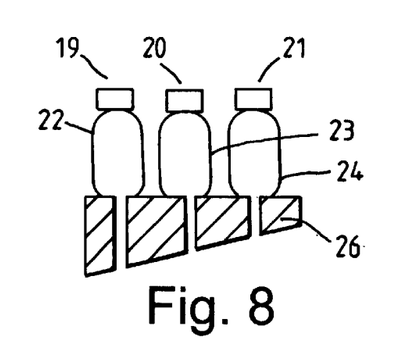
FIG. 8 is a cross-sectional view of a another audio trigger device using air pipes.

A mechanically operated audio trigger device may take several forms and FIG. 7 and FIG. 8 show two suitable arrangements. The buttons 19, 20 and 21 are mounted on top of open-bottomed air bags 22, 23 and 24. The bags are attached to a base 25 that in FIG. 7 have apertures of different cross-sectional areas and to a base 26 in FIG. 8 that has apertures of different effective lengths. As a result, (finger) depression of the button 19, 20, 21 creates sounds of different frequencies (i.e. tones) in each case. The air bags are made of resilient material so that when the buttons have been pressed down and then released, the bags return to their original shapes. Other mechanical methods known in the art can also be applicable to generate audio signals with different tones in the trigger devices.

Figure 9:
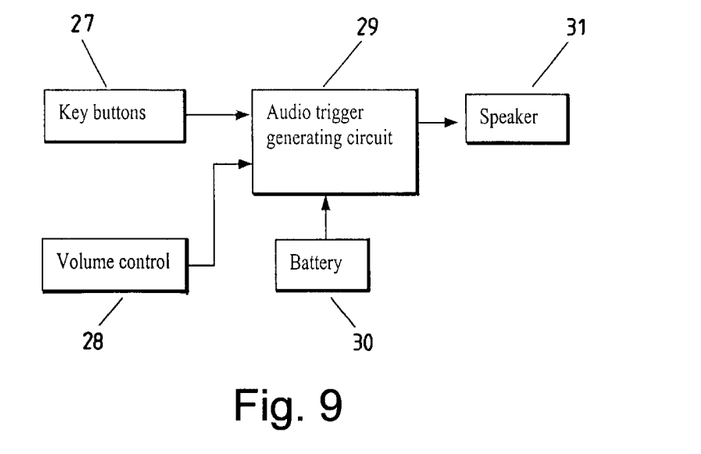
FIG. 9 is a schematic diagram of an electrical audio trigger device.

The trigger signals can also be generated using electrical circuits. FIG. 9 shows a diagram for electrical audio generator used alone. An audio generating circuit 29 is used to generate trigger signals whenever one or more key buttons 27 are depressed. The trigger signals are transmitted by a speaker or buzzer 31 and received by the main equipment. The audio generating circuit can be realized with any forms known in the art such as transistor oscillators, IC oscillators or microprocessor controlled audio synthesizers for example. A volume control 28 can be arranged to adjust the loudness of the audio control signals for different situations. A battery 30 is used to supply powers for the circuits.

Figure 10:
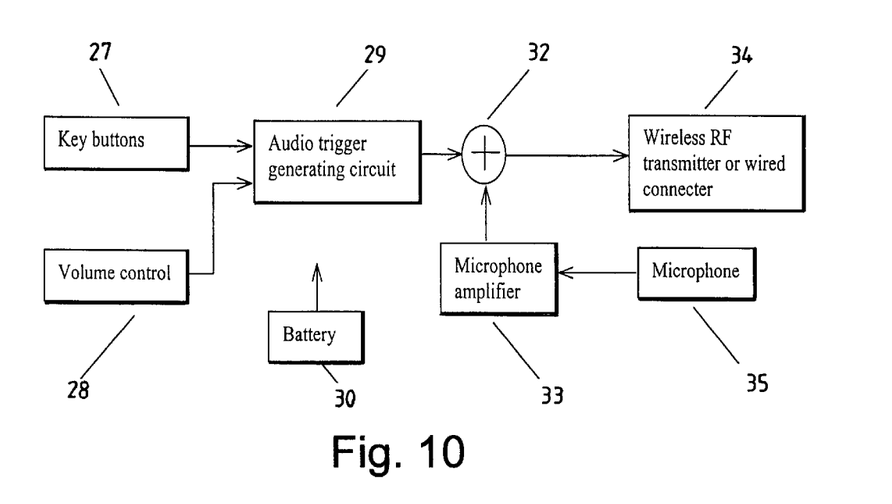
FIG. 10 is a schematic diagram of an electrical audio trigger device embedded in a microphone.

In FIG. 10, an audio trigger device is embedded within a wireless or wired microphone. The trigger signals generated by the audio generating circuit 29 are combined with the audio signals, which are collected by the microphone 35 and amplified by the microphone amplifier 33, using a summation circuit 32. The combined audio signals are transferred to the main equipment via wireless RF transmitter or wired connector 34 for wireless and wired microphone, respectively. Battery 30 provides power supplies to all the circuits.

In FIG. 10, an audio trigger device (27, 28 and 29) provide signals that are not audible as such. What is produced are electrical signals in the normal audio range. This range is determined, or defined, by the normal range (of electrical signals) that the main equipment normally detects as 'audio signals' for reproducing audible signals for a loudspeaker. Thus, in same embodiments of the invention and elsewhere in the specification and claims, the term "audio trigger device" includes devices capable generating audible (including ultra sonic) signals or electrical signals in the normal audio range, as the case may be.

Figure 11:
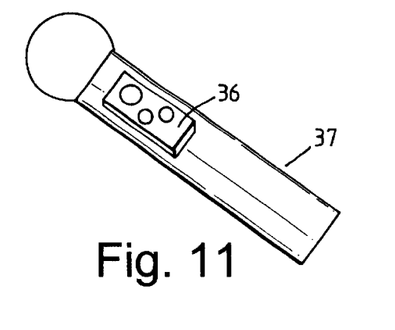
FIG. 11 is an isometric view of an audio trigger device attach ed to a microphone.
Figure 12:
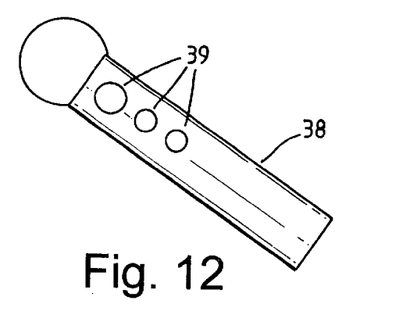
FIG. 12 is an isometric view of an audio trigger device embedded in a microphone.
Figure 13:
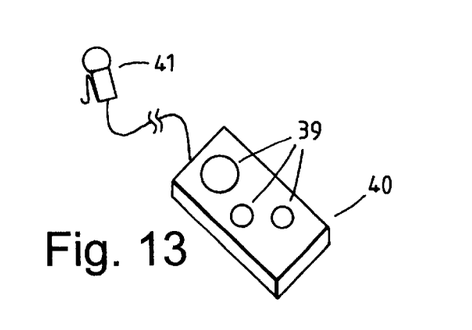
FIG. 13 is an isometric view of an audio trigger device embedded in a wireless microphone transmitter.

FIGS. 11, 12 and 13 show three forms of an audio trigger device used with a microphone. In FIG. 11, a stand alone audio trigger device 36 is attached to the handle of a hand-holdable microphone 37 (wireless or wired). The audio trigger signals (which will normally be audible) generated by the trigger device can be collected and amplified by the microphone and collected by the main equipment as other voice signals. In FIG. 12, the audio trigger device is embedded within a microphone 38 and generates electrical signals in the audio range. One or more (three in the figure for example) key buttons 39 for activating the audio generating circuit are arranged on the handle of the microphone 38. A communication channel which may be comprise a hard-wire channel or a radio channel connects the microphone 38 to the main equipment.

In FIG. 13, the audio trigger device arranged to generate electrical signals in the audio range, is embedded within the control box 40 of a pocket-wearable wireless microphone. The control may be supported along a wire some distance from the microphone for more convenient manual operation of the key buttons. One or more (three in the figure for example) of the key buttons 39 for activating the audio generating circuit are arranged on the surface of the control box 40. The mini microphone 41 can be clipped onto the clothes of the presenter. Voice signals and the trigger signals, are transmitted to the main equipment by a wireless communication channel.

Figure 14:
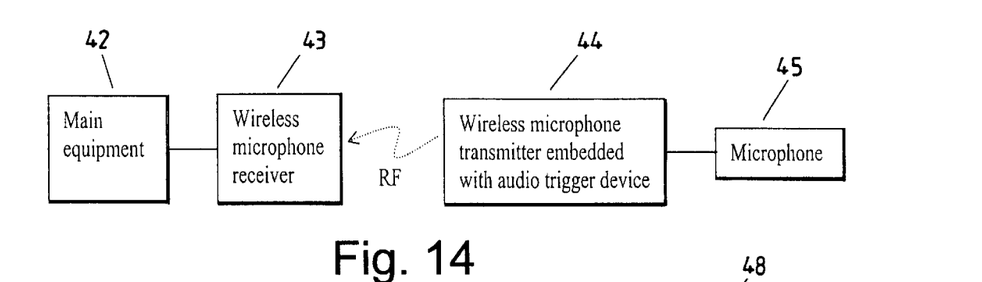
FIG. 14 is a schematic diagram of an exemplary channel for transmitting audio control signals from the trigger device to the main equipment.
Figure 15:
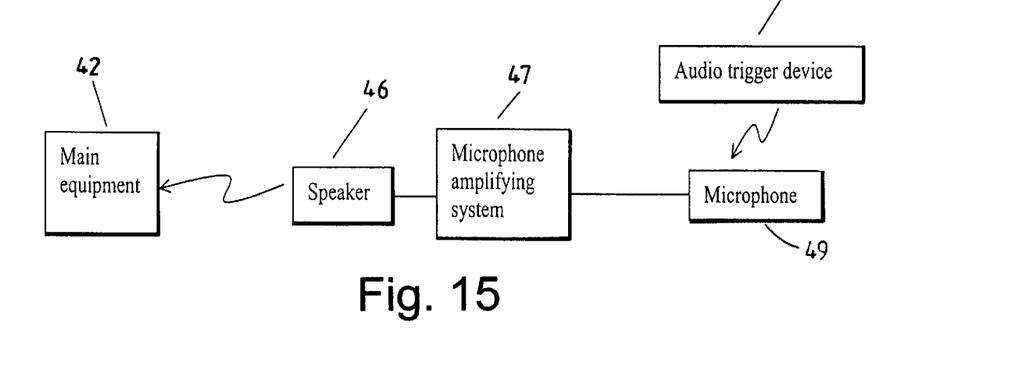
FIG. 15 is a schematic diagram of a further exemplary channel for transmitting audio control signals from the trigger device to the main equipment.

If the internal microphone of a computer is used to collect trigger signals, the control distance of the audio trigger device is limited. By using the configurations shown especially in FIGS. 12 and 13. The control range of the audio trigger device can be extended. This capability is further explained by reference to FIGS. 14 and 15. In FIG. 14, a wireless microphone transmitter 44 embedded with a audio trigger device transmitting both audio signals collected from microphone and generated by the trigger device to the wireless microphone receiver 43, which is connected to the main equipment 42. The main equipment 42 can then detect the trigger control signals as commands. In FIG. 15, a microphone amplifying system 47, a microphone 49 and a speaker 46 are used as a relay between the audio trigger device 48 and the main equipment 42. A microphone amplifying system is commonly available in many situations with a large audience. In this way, the trigger signals generated by the audio trigger device 48 can be transmitted over a significant distance to a normal microphone of the main equipment 42.

Figure 16:
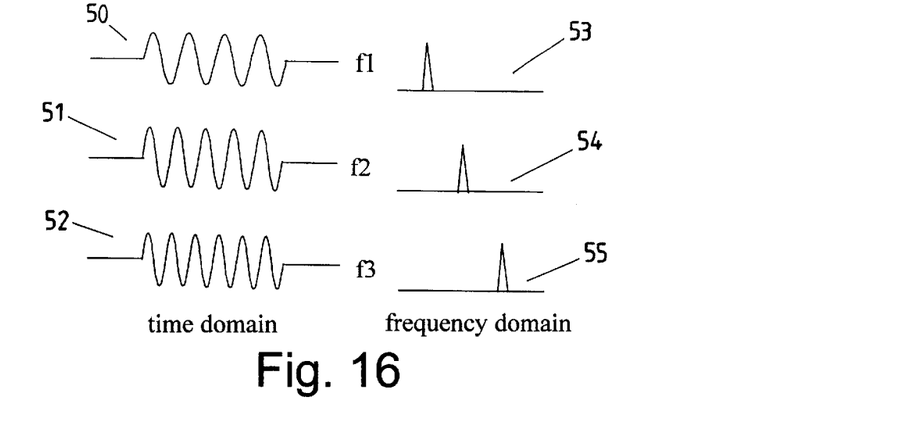
FIG. 16 is a diagram of an example of frequency-coded audio trigger signals for three commands.
Figure 17:
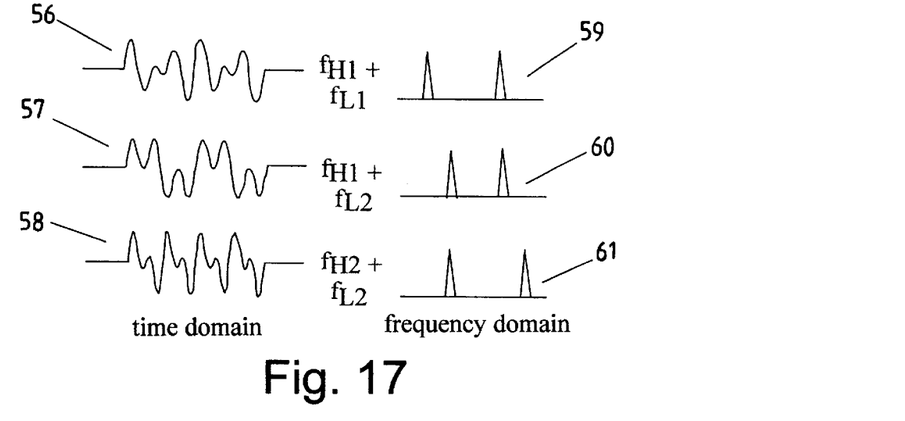
FIG. 17 is a diagram of a further example of frequency-coded audio trigger signals for three commands.
Figure 18:
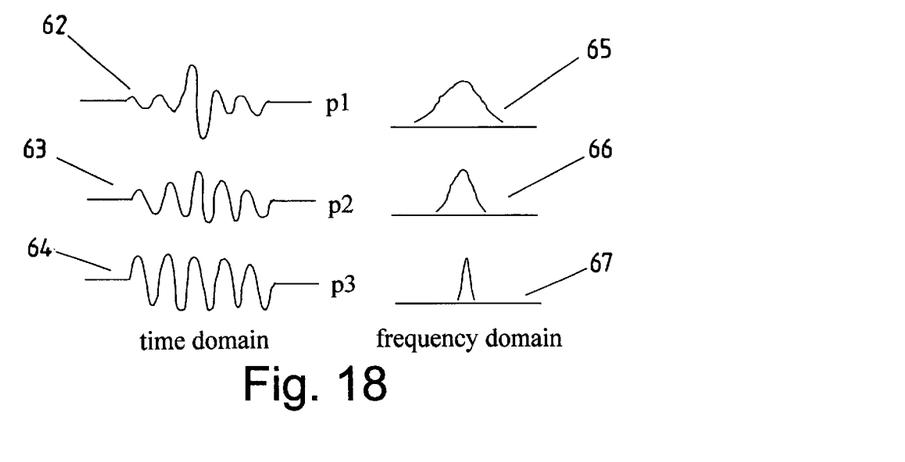
FIG. 18 is a diagram of a yet further example of frequency-coded audio trigger signals for three commands.
Figure 19:
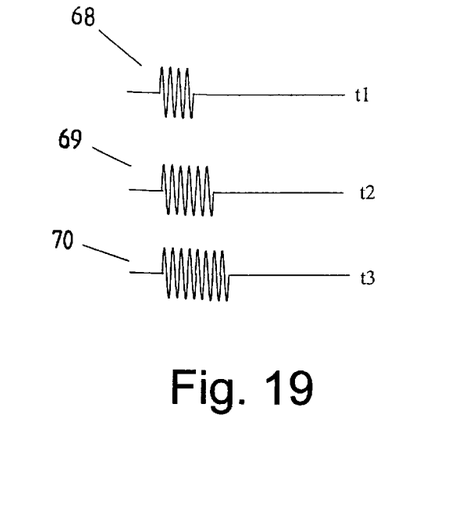
FIG. 19 is a diagram of an example of time-coded audio trigger signals for three commands.

The waveforms of the audio trigger signals can be simple, like single tones generated with mechanical trigger device shown in FIGS. 7 and 8, or more complicated. FIGS. 6, 17, 18 and 19 show four examples of waveform patterns for three different trigger signals and their features in frequency domain. In FIG. 16, three trigger signals 50, 51 and 52 are assigned with different single frequencies 53, 54 and 55 respectively. In FIG. 17, three trigger signals 56, 57 and 58 are assigned with different combinations of dual frequencies 59, 60 and 61 respectively. Trigger signals comprising more than one frequency are not so easily disturbed by signals generated by other sources. In FIG. 18, three trigger signals 62, 63 and 64 are assigned with different patterns of frequency spectrums 65, 66 and 67 respectively. The detecting programs running in the main equipment can analyze the trigger signals using algorithms like FFT (Fast Fourier Transform) for example to determine these spectrum patterns. In FIG. 19, three trigger signals 68, 69 and 70 are assigned with different periods of a waveform with a constant frequency. Trigger signals with other features in time domain and/or frequency domain can also be used. In addition, trigger signals with ultrasound frequency can also be used as long as they can be transmitted from the trigger device to the main equipment via the audio channel. To avoid the influence of environmental noises, which generally comprise low frequencies, trigger signals with higher frequency can be selected.

Figure 20:
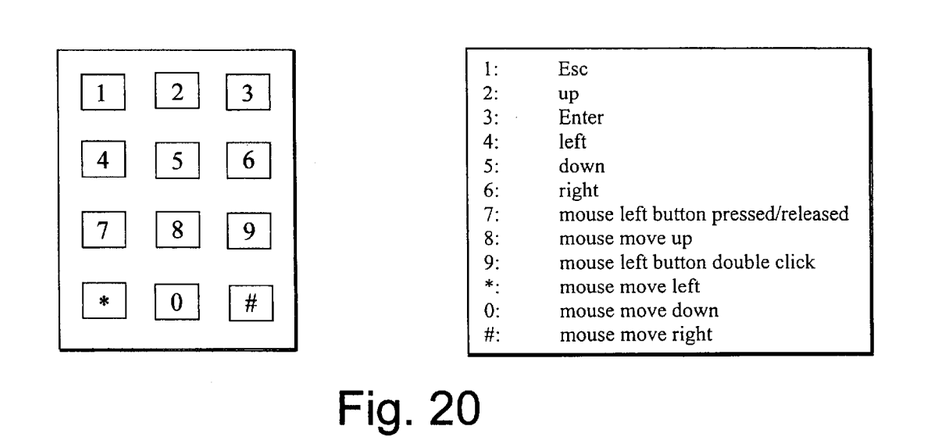
FIG. 20 is an example of command assignment for 12 keys of a mobile phone.

In addition to a audio trigger device specifically designed for generating control trigger signals, any existing handholdable electrical appliances, such as mobile phone, PDA (personal digital assistant), digital organizer, digital dictionary, can be used to generate a group of trigger signals with different features. Thus, these devices can also be used to control the main equipment using an audio control method described in this specification. For example, each mobile phone has these 12 keys for dialing, and their position arrangement is almost the same as shown in FIG. 20. When a key is pressed on the mobile phone, a dual touch tone, similar to those shown in FIG. 17, is generated. The 12 key dual touch tones are coded with a high tone group with 3 different frequencies and a low tone group with 4 different frequencies. Since dual touch tones conform to an international standard, the audio remote control program designed for the tone coding can be used with any model of mobile phone. An example for assigning commands for the 12 keys is shown in FIG. 20. A single tone of the high frequency group can be detected to identify key 1, 2 and 3. Since the low frequency group is not detected, key 4, 7 and * is the same as key 1; key 5, 2 and 0 is the same as 2; and key 6, 9 and # is same as key 3. Three keys are therefore sufficient for controlling the basic command of a computer slide presentation, for example, described earlier.

Figure 21:
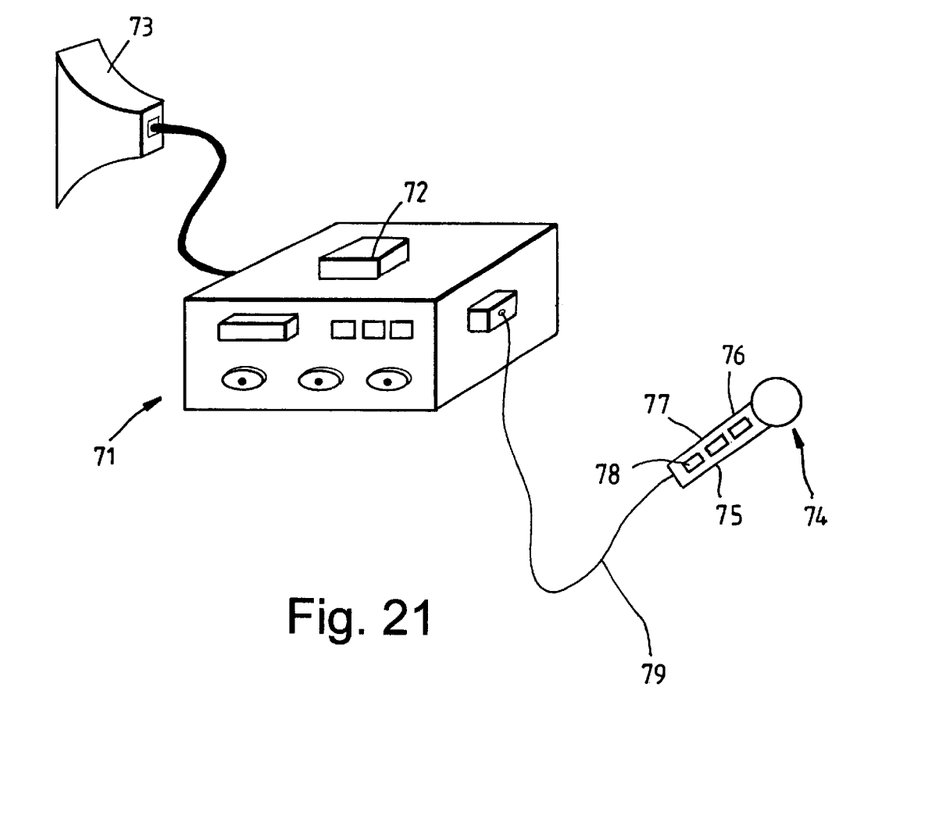
FIG. 21 is a schematic layout of a music center installation.

In FIG. 21, a 'main equipment' is a music centre 71 that has an audio amplifier 72, a loudspeaker 73 and a microphone 74. An audio trigger device is mounted on a handle 75 of the microphone. The trigger device has three buttons 76, 77 and 78. In the same way as described above, the buttons can be depressed to provide different audio trigger signals, that is signals of different tones or representing different tones (or other features in time or frequency domain), to create different command signals for the music centre. The command signals are typically used to change the output to the loudspeaker 73. The command signals are picked up by the microphone 74 and the music centre receives these signals via a cable 79. The cable 79 is the cable that normally connects the microphone to the music centre and which is used for normal voice signal transmission when the singer talks or sings. The cable 79 can be replaced by a wireless link which is common for wireless microphone. In this way, a singer can send various commands to the music centre by selectively depressing the buttons 76, 77 and 78 to change a setting or provide an instruction to alter an operation (e.g. change an output volume) of the music centre. As such, the singer can in effect remotely control the music centre from wherever hie is standing to perform his act or sing his songs. Furthermore, the audio trigger signals sent by the singer can be used for other purposes beyond controlling sound effects, such as controlling light effects and slide projecting effects of a studio or theatre, and transforming information to operators backstage. In some situations such as in the presentation of a concert, the music centre can first filter out the trigger signals for control purposes, using methods known to the art, from the voice signals before they are outputted by speakers to avoid disturbances to the audience otherwise caused by the command signals.

It will be appreciated that the audio trigger device may be extremely simple where, say, only one type of command is required. Thus the audio trigger device may be a "clicker" or a whistle, for example.

It is also possible to pre-prepare the audio trigger device command signals on a recording. Thus, a recorded voice presentation of a lecture, say, may include recorded and synchronized audio trigger signals that are used as the command signals to change accompanying slides automatically during a recorded presentation.

I claim:

1. A trigger computer presentation control system comprising:

an audio trigger device having a number of buttons that can be depressed to create different audio signals with different features, and a computer running a slide presentation software that has an audio channel to collect sound signals, in which the features are detected by the computer as commands for controlling the progress of the slide presentation by simulating keystrokes, mouse actions, and their combinations for the control commands of the presentation software.

2. A trigger computer control system comprising:

laser pointing means, and audio trigger generating means having a number of buttons, one of which can be depressed to activate the laser pointing means to generate a laser beam for pointing, and others of which can be depressed to activate audio trigger generating means to create audio signals with different features for the computer, in which the signals act as command signals for altering or controlling operation of the computer.

3. An audio trigger control system including:

a microphone for receiving aural presentation sounds of a user, a main equipment including an amplifying circuit and a loudspeaker, an audio trigger device generating trigger signals with different features in response to depressing a number of buttons mounted on a surface of the microphone, and a communication channel connecting the microphone to the main equipment for transmitting the aural presentation and the trigger signals to the main equipment, in which the trigger signals transmitted are detected and act as command signals for altering or controlling operation of the main equipment, including altering or controlling amplification to adjust presentation sound outputs of the loudspeaker.

4. The audio trigger control system according to claim 3, in which the communication channel is a radio channel.

* * * * *